(12) United States Patent
Alizadehyazdi et al.

(10) Patent No.: US 11,872,691 B2
(45) Date of Patent: Jan. 16, 2024

(54) SOFT, ADAPTIVE, SELF-CLEANING ELECTROSTATIC GECKO-LIKE ADHESIVE AND GRIPPER

(71) Applicants: Vahid Alizadehyazdi, Chicago, IL (US); Matthew Spenko, Chicago, IL (US)

(72) Inventors: Vahid Alizadehyazdi, Chicago, IL (US); Matthew Spenko, Chicago, IL (US)

(73) Assignee: ILLINOIS INSTITUTE OF TECHNOLOGY, Chicago, IL (US)

( * ) Notice: Subject to any disclaimer, the term of this patent is extended or adjusted under 35 U.S.C. 154(b) by 727 days.

(21) Appl. No.: 16/856,515

(22) Filed: Apr. 23, 2020

(65) Prior Publication Data

US 2020/0338750 A1 Oct. 29, 2020

Related U.S. Application Data

(60) Provisional application No. 62/875,589, filed on Jul. 18, 2019, provisional application No. 62/844,356, filed on May 7, 2019, provisional application No. 62/837,814, filed on Apr. 24, 2019.

(51) Int. Cl.
| | |
|---|---|
| H01L 41/18 | (2006.01) |
| B25J 15/00 | (2006.01) |
| B25J 15/08 | (2006.01) |
| B06B 1/06 | (2006.01) |
| C09J 7/20 | (2018.01) |
| H10N 30/87 | (2023.01) |

(Continued)

(52) U.S. Cl.
CPC ........... *B25J 15/008* (2013.01); *B06B 1/0662* (2013.01); *B25J 15/086* (2013.01); *C09J 7/20* (2018.01); *H10N 30/1051* (2023.02); *H10N 30/87* (2023.02); *G01N 27/60* (2013.01)

(58) Field of Classification Search
CPC .. H01L 41/047; H01L 41/0805; B06B 1/0662
See application file for complete search history.

(56) References Cited

U.S. PATENT DOCUMENTS

| | | | |
|---|---|---|---|
| 2006/0220403 A1* | 10/2006 | Shin | ..................... B25J 15/0616 294/86.4 |
| 2013/0180448 A1* | 7/2013 | Sakaue | ............. H01L 21/67739 118/696 |
| 2017/0162780 A1* | 6/2017 | Takahashi | .............. H10N 30/06 |

FOREIGN PATENT DOCUMENTS

JP 2000100920 A * 4/2000

OTHER PUBLICATIONS

English Translation of JP 2000100920, Tomita (Year: 2000).*

(Continued)

*Primary Examiner* — Bryan P Gordon
(74) *Attorney, Agent, or Firm* — Pauley Erickson & Swanson

(57) ABSTRACT

An adhesive apparatus with an electrostatic adhesive including a microstructured adhesive disposed over an electrode and/or a piezoelectric element. The adhesive can be added to any robotic gripper, such as a gripper finger formed of a flexible material and including a grip surface. The electrode and/or a piezoelectric element can be used for applying an electrostatic field and/or ultrasonic vibration, configured for cleaning the microstructured adhesive, releasing the adhesive, and/or sensing a load on the adhesive apparatus.

21 Claims, 15 Drawing Sheets

(51) Int. Cl.
*H10N 30/00* (2023.01)
*G01N 27/60* (2006.01)

(56) References Cited

OTHER PUBLICATIONS

Glick, P., et al., "A Soft Robotic Gripper With Gecko-Inspired Adhesive," IEEE Robotics and Automated Letters, Apr. 2018, vol. 3, No. 2, pp. 903-910.
Festo AG & Co. KG, "MultiChoiceGripper" Brochure, Apr. 2014, Esslingen, Germany (6 pages).

* cited by examiner

SOFT, ADAPTIVE, SELF-CLEANING ELECTROSTATIC GECKO-LIKE ADHESIVE AND GRIPPER

CROSS REFERENCE TO RELATED APPLICATIONS

This application claims the benefit of each of: U.S. Provisional Application Ser. No. 62/837,814, filed on 24 Apr. 2019; U.S. Provisional Application Ser. No. 62/844,356, filed on 7 May 2019; and U.S. Provisional Application Ser. No. 62/875,589, filed on 18 Jul. 2019. The provisional applications are hereby incorporated by reference herein in its entirety and is made a part hereof, including but not limited to those portions which specifically appear hereinafter.

STATEMENT REGARDING FEDERALLY SPONSORED RESEARCH

This invention was made with government support under grants NNX16AF05G and NNX16CP19C awarded by NASA. The government has certain rights in the invention.

FIELD OF THE INVENTION

This invention relates generally to using electrostatic and/or ultrasonic techniques to clean dust and other contaminants, and more particularly to methods, device, and systems of using electrostatic or the combination of electrostatic and ultrasonic techniques to clean gecko-like, micro-structured adhesives.

BACKGROUND OF THE INVENTION

There has been considerable demand for controllable (i.e., on/off) adhesives for robotic grippers, climbing robots, and perching drones that can operate on a wide variety of surface materials and roughness. Directional gecko-like adhesives (also known as dry, microstructured, bio-inspired, fibrillar, or insect-inspired adhesives, among others) are a type of controllable adhesive that has shown to work well on a variety of surfaces. However, most of these microstructured adhesives have, for the most part, been tested in laboratory environments, with carefully cleaned surfaces and adhesives; the research neglects to account for the effect of dust that accumulates on the pads and can significantly decrease the adhesion.

Cleaning of microstructured surfaces generally falls into two categories: minimizing dust adsorption through adhesive design and removing dust particles that adhere to the surface. Dust adsorption on a microstructured surface can be minimized through several methods, including making the microstructured features smaller than the size of the contaminants, increasing the roughness of the surface, and using stiff materials that have low surface energy. These methods decrease dust adsorption but unfortunately, also decrease adhesion to a substrate.

Methods to remove dust particles from microstructured surfaces include wet cleaning and dry contact cleaning. Wet cleaning occurs when a micro-structured surface is made hydrophobic and any water droplets applied to the surface will capture and transport contaminants; this limits operation when water is not available. Dry contact cleaning involves dragging the adhesive across a substrate to remove particles. The method works well when there is clean surface to shed the particles, but this may not be achievable in all field environments. Moreover, dry contact cleaning may damage the microstructured features through repeated use.

There is also growing demand for controllable robotic grippers that can operate on a wide variety of surface materials and roughness. Soft adaptive grippers have been one of best answers to this demand, which make it possible to have deformation to grasp the objects with complicated shapes. Furthermore, there is growing need for mobile robotic platforms, such as small unmanned aerial vehicles with grippers that allow the robot to perch onto surfaces and maintain that positions for an extended period of time as well as robotic manipulators with grippers capable of grabbing objects of different shapes and sizes.

Thus, there is a continuing need for improved microstructured adhesives, and for improved cleaning of such adhesive surfaces.

SUMMARY OF THE INVENTION

A general object of the invention is to provide microstructured adhesive materials, and methods, devices, or systems for allowing microstructured adhesives (e.g., gecko-like adhesives) to be used in field conditions.

The invention includes a non-destructive, non-contact cleaning method and/or system to clean dust and other contaminants from microstructured adhesives, making them more suitable for uses in field conditions (e.g., the uses with robotic grippers, climbing robots, and perching robots to operate in real-world environments).

Embodiments of this invention include devices, systems and methods to mitigate dust or other contaminant on microstructured adhesives (e.g., gecko-like adhesives) using electrostatic forces. In preferred embodiments of the invention, electrostatic adhesive is combined with gecko-like adhesives. Embodiments of such gecko-like adhesive include, but are not limited to microstructured gecko-like adhesive wedges. The electrostatic adhesives include electrode arrangements and signal connections for various configurations (e.g., single, two and three-phase configurations). Layers of high-dielectric insulator (e.g., Kapton) and/or insulator painting (e.g., resin) can be added to decrease the risk of a voltage short between electrodes.

The present invention provides devices and systems to clean dust and other contaminants from microstructured adhesives, such as by using an electrostatic adhesive, and/or a piezoelectric device. Embodiments of such electrostatic adhesive include layer(s) of electrodes arranged with a pre-designed pattern and signal connections with different controllable configurations and layer(s) of insulators. In embodiments of this invention, electrostatic adhesive includes electrode pattern (e.g., circular inter-digital electrode patterns) with electrodes and gaps between adjacent electrodes on a high-dielectric insulator (e.g., Kapton) base.

Embodiments of this invention can additionally or alternatively include a piezoelectric device. Embodiments of this invention can also further include an inter-digital piezoelectric device that matches the geometry of the current electrode designs.

This invention further includes methods of controlling adhesion, cleaning, and sensing (e.g. force or contact) devices, methods and systems for adhesives, and, more particularly, to devices and methods using piezoelectric element(s) for controlling adhesion, cleaning, and sensing in microstructured adhesives, such as dry or gecko-like adhesive grippers.

Embodiments of the invention include a method to improve or restore controllability in microstructured adhesives (e.g., gecko-like adhesives) by using a piezoelectric element to detach, or at least assist in detaching, the substrate or object from the adhesive.

The invention further includes devices and methods using one or more piezoelectric element(s) combined with a microstructured adhesive to detect contact of the adhesive to a substrate and/or preload. The piezoelectric element can be used to perform as a force/contact sensor.

Embodiments of the invention also include devices and methods using piezoelectric element(s) combined with microstructured adhesive to remove dust from the adhesive. The cleaning function of piezoelectric elements can provide an adhesive that is practical for real-world environments where dust or other contaminants are present.

In accordance with another aspect of the invention, a piezoelectric device provides ultrasonic cleaning for microstructured adhesives and mitigates dust or other contaminants in real-world applications.

In accordance with another aspect of the invention, the output voltage of the piezoelectric device is correlated with the preload experienced by the adhesive when in contact with an object. By evaluating the output voltage of the piezoelectric device, contact of the adhesive to a substrate and/or force can be detected for the adhesive.

The invention further includes a gripper for robots and robotic applications, particularly an adaptive gripper that can grip objects with different shapes, sizes and materials. Another more specific aspect of the invention provides an adaptive gripper that includes a self-cleaning mechanism, making it more suitable for uses in field conditions. Accordingly, the general object of the invention can be attained, at least in part, through combination of electrostatic micro structured adhesive coupled with a soft adaptive gripper.

This invention further includes a gripper finger, a gripper with at least one such gripper finger, and the method to fabricate and actuate such finger(s) for the gripper. More particularly, the invention relates to a soft, adaptive, electrostatic gecko-like adhesive gripper that can grip objects of different shapes, sizes, and/or materials, and the method of making and using such gripper. Moreover, this gripper can use its electrostatic component not only for adhesion but also for cleaning the gecko-like adhesives.

In embodiments of this invention, such electrostatic microstructured adhesive is made in the form as an adhesive pad and attached to the contact surface of the soft gripper finger. A resilient material, for example silicone foam, can be used between the electrostatic adhesive and the contact surface of the soft gripper finger to make the adhesives more adaptive to an object's shape. Double-sided tape can be used to attach the silicone foam to a soft gripper finger and/or the electrostatic gecko-like adhesive.

Other objects and advantages will be apparent to those skilled in the art from the following detailed description taken in conjunction with the appended claims and drawings.

DETAILED DESCRIPTION OF THE INVENTION

The invention provides self-cleaning devices/mechanisms/systems for microstructured adhesives, more specifically for gecko-like microstructured adhesives (also known as dry, bio-inspired, fibrillar, or insect-like adhesives, among others), while maintaining the adhesion. Accordingly, a general object of the invention can be obtained through methods, devices, and systems using electrostatic repulsion and/or ultrasonic cleaning techniques. Embodiments of the invention include or incorporate electrostatic repulsion, optionally from or combined with a piezoelectric element that removes dust through displacement of the piezoelectric device when a voltage is applied.

Figure 1:
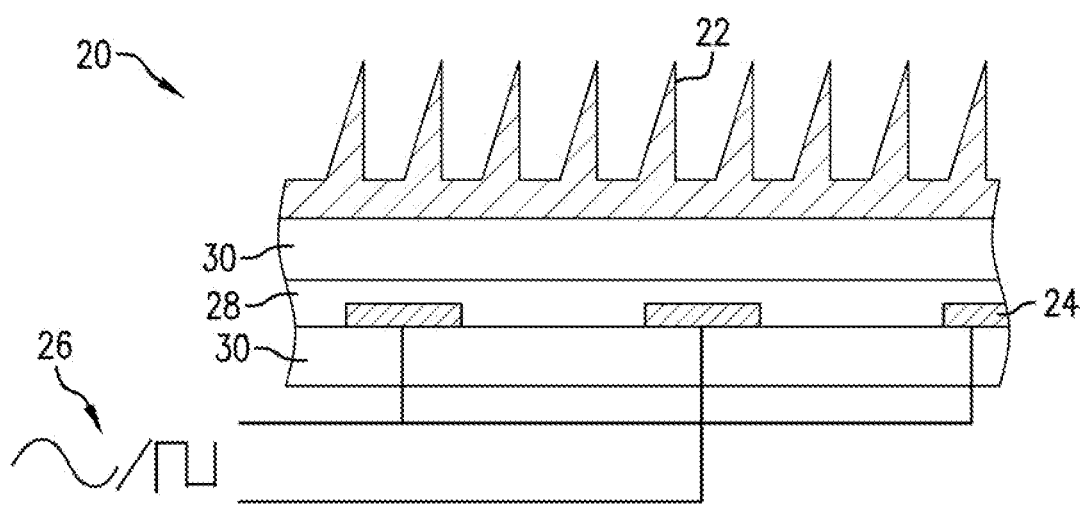
FIG. 1 shows a sectional view of an electrostatic adhesive apparatus according to one embodiment of this invention.

FIG. 1 shows an electrostatic adhesive 20 according to one embodiment of this invention. The electrostatic adhesive 20 includes a top layer of a microstructured adhesive 22 over an electrode 24. The electrode is in combination with an excitation signal 26, and can structured in an electrode pattern defined within or throughout insulator material 28. One or more layers of dielectric, e.g., Kapton dielectric 30 can be further used on one or both sides of the electrode 24 and insulator 28 structure.

FIGS. 2A-F illustrate a formation of a microstructured adhesive according to one embodiment of this invention. Adhesive fabrication in embodiments of this invention includes two processes: casting polydimethylsiloxane (PDMS) or other suitable material in a mold to generate microwedges, and, as needed, post-treating the microstructured elements to create a smooth cap on the wedges' tips.

Figure 2A:
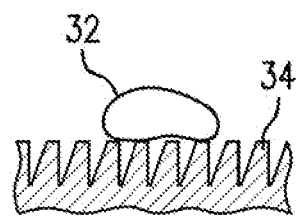
FIGS. 2A-2F show a method of forming a microstructured adhesive, according to one embodiment of this invention.
Figure 2B:
Figure 2C:
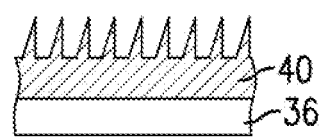

To fabricate the microstructure adhesives, PDMS or other suitable material 32 is casted in a negative wax mold of the microstructured adhesive wedges 34 in FIG. 2A. In FIG. 2B, the material 32 is spun, e.g., at 1200 rpm for 40 seconds, on the surface of the mold. The mixture is degassed while on the mold and cured in an oven. The mixture may be cured without an oven as well. After curing, in FIG. 2C, double sided tape 36 can be used to detach the microstructure adhesive material 40 from the mold.

Figure 2D:
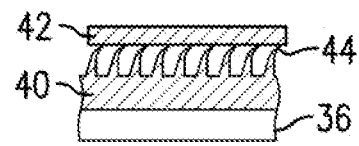
Figure 2E:
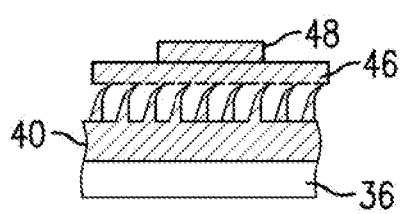
Figure 2F:
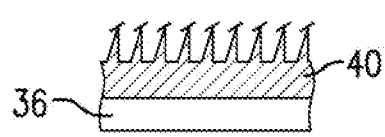

For the post-treatment process of FIG. 2D, a material such as Smooth Sil 960 is prepared based on the manufacturer's specifications. 50 wt % Heptane is added, and the resulting mixture is spun on a clean glass plate 42 at 5000 rpm for 45 s to create a thin, uniform layer of polymer 44. The glass plate 42 with the thin layer of Smooth Sil 960 is brought into contact with the microstructures to transfer the polymer. After carefully removing the layer of glass 42, a second sheet of clean glass 46 along with a weight 48 is placed on the microstructures to apply a 0.5 kPa load (FIG. 2E). The sample is cured in an oven at 60° C. for 30 min and then at 120° C. for 30 min. A cross-sectional schematic of the final structure is shown in FIG. 2F.

In embodiments of this invention, the electrode of the electrostatic adhesive provides a non-destructive, non-contact cleaning method and/or system, using electrostatic forces via the electrode to clean (repel) dust and other contaminants from the microstructured adhesive, making them suitable for uses in field conditions (e.g., uses with robotic grippers, climbing robots, and perching robots to operate in real-world environments). Electrostatic repulsion according to this invention is a non-destructive technique that does not require any mechanical contact with external inputs like clean surfaces or water. Moreover, the use of electrostatic repulsion does not preclude use of other cleaning methods such as wet or dry cleaning methods, and thus electrostatic repulsion can be used in addition to other techniques, if desired. Furthermore, in cyclic robotic applications, electrostatic cleaning can occur during periods where the robot is moving but no adhesion is needed, such as the flight phase of a legged climbing robot, or the time between releasing one part and picking up another for a gripper on a manipulator arm. This can improve efficiency by eliminating the need to interrupt operation for cleaning.

In embodiments of this invention, with reference to FIG. 1, a voltage is applied to a set of, for example, parallel electrodes 24 embedded in a dielectric 30 to induce an electrostatic force on or between particles to be removed from the microstructured adhesive. The power consumption during cleaning can be less than 1 W (high voltage, but low current) and no specific controller is required, which makes this method practical for many applications. Investigation of the frequency and phase-lag effects on three-phase signals (the most commonly studied phasing) demonstrated that low frequencies typically generate relatively higher vertical displacement on particles. Analysis of wave shape for a three-phase electrostatic actuator for particle handling showed that square waves are effective for particle transportation.

Figure 3A:
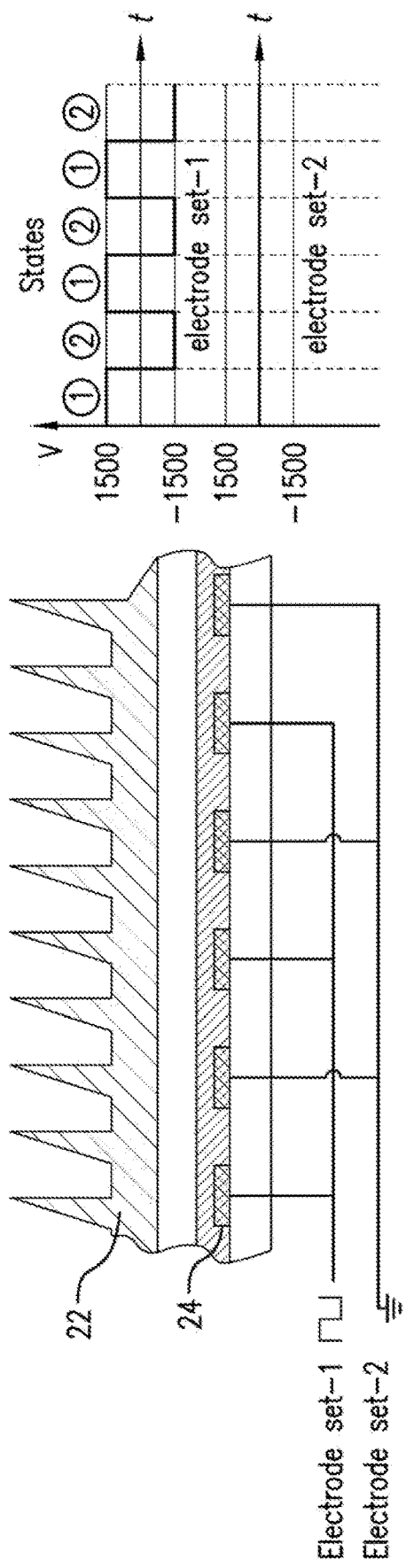
FIGS. 3A-3C each shows a sectional view of an alternative electrode configuration for an electrostatic adhesive apparatus, according to one embodiment of this invention.
Figure 3B:
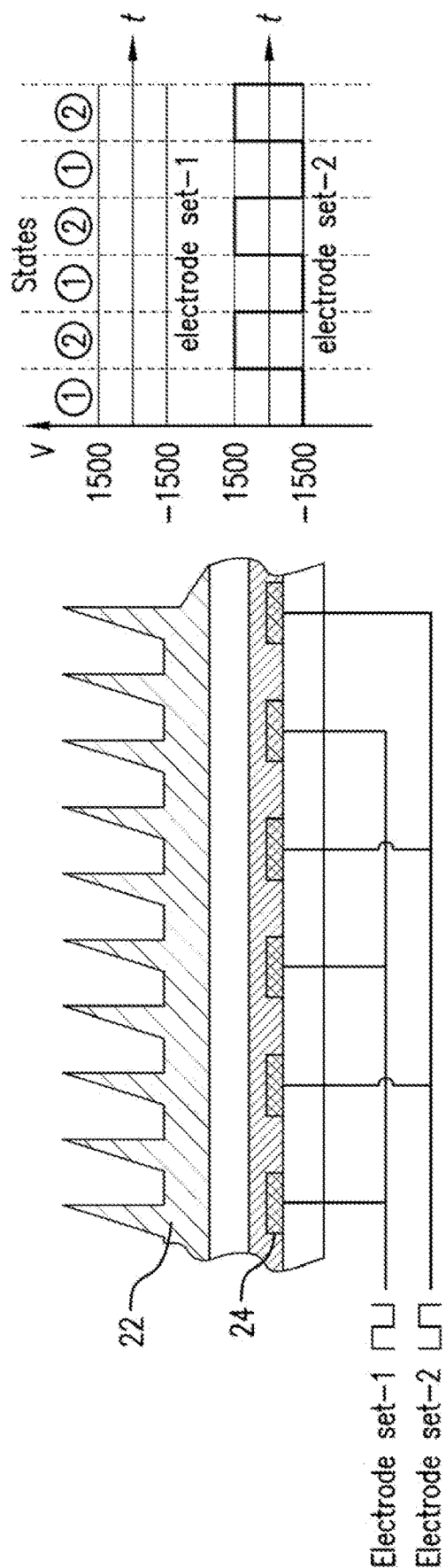
Figure 3C:
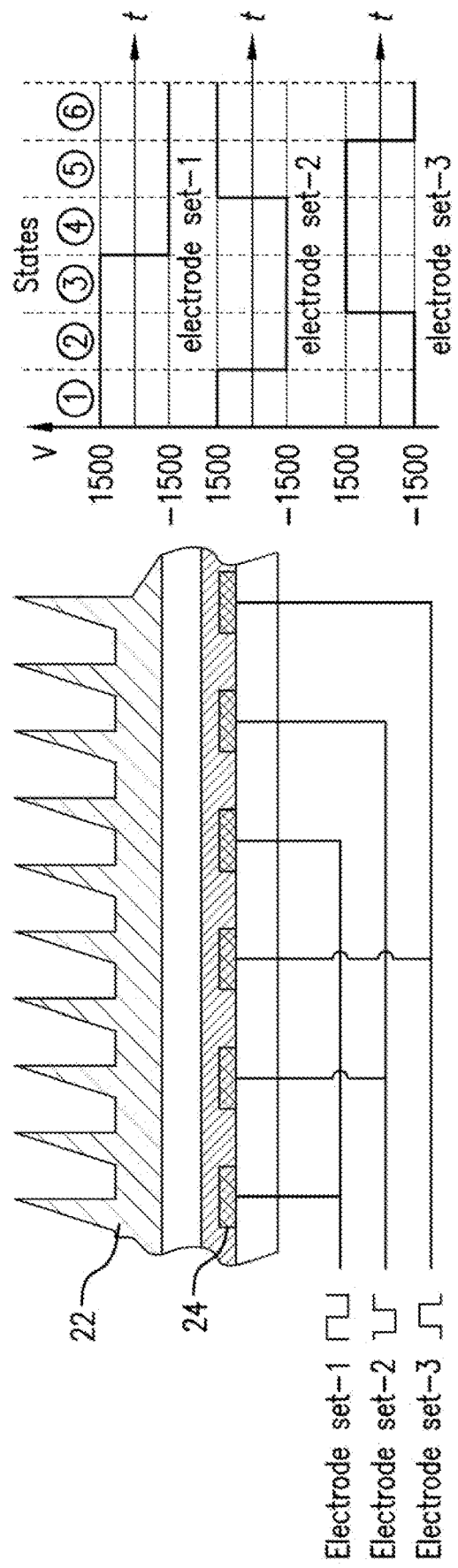

FIGS. 3A-C illustrate exemplary electrode array configurations when excited by square waves. FIG. 3A shows an arrangement of electrodes, with connection to signal source and voltage waveform in one cycle in a single-phase configuration. FIG. 3B shows an arrangement of electrodes, with connection to signal source and voltage waveform in one cycle in a two-phase configuration. FIG. 3C shows an arrangement of electrodes, with connection to signal source and voltage waveform in one cycle in a three-phase configuration. Note that the electrode width and gap between adjacent electrodes are not drawn to scale. The right side of the figures show the respective voltage waveforms and electrode states. For single-phase excitation, one set of electrodes is connected to the ground and the other to the signal's source, resulting in two possible states. For two-phase excitation, electrode sets are connected to signals 180° out of phase, which also results in two possible states. For three-phase excitation, three sets of electrodes receive signals with a 120° difference in phase. This results in six possible states.

Because the electrostatic field is not uniform, the angle between the electrodes and microstructures can affect dust mitigation. As an example, in one embodiment, electrodes disposed parallel to the microstructures was found to have better cleaning efficiency that electrodes running perpendicular to the microstructures. Electrostatic frequency can also affect cleaning. Increasing the frequency generally decreases cleaning time due to an increased number of cycles; however, it also simultaneously decreases the cleaning efficiency because the particles are exposed to a shorter charging time. These two opposing phenomena explain why 5 Hz, for a 30 second running time, has been found to be optimal for experimental implementations.

Figure 4:
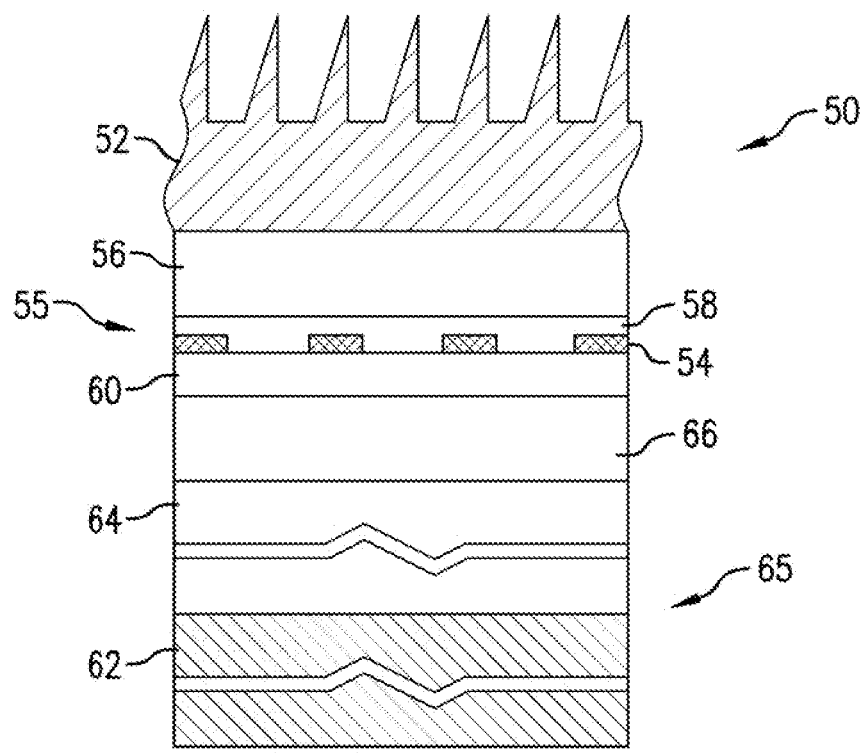
FIG. 4 shows a sectional view of an electrostatic adhesive according to one embodiment of this invention.

In embodiments of this invention, the electrostatic adhesive includes a piezoelectric element, in combination with or in place of the electrodes discussed above. FIG. 4 illustrates an electrostatic adhesive 50 according to one such embodiment of this invention, including or incorporating electrostatic repulsion combined with a piezoelectric element that removes dust through displacement of the piezoelectric device when a voltage is applied.

Electrostatic adhesive 50 includes a top layer of microstructured adhesive 52 combined with an electrostatic pad 55, such as by double sided tape 56. An insulator 58 is disposed around electrode 54 and between the electrode 54 and the tape 56. A Kapton dielectric layer 60 is disposed below the electrode 54. A unimorph piezoelectric device 65 is connected to the electrostatic pad 55, on an opposite side of the electrode 54 from the microstructured adhesive layer 52. Piezoelectric device 65 includes a piezoelectric element or layer 62, such as a piezo ceramic, and a stainless steel membrane 64. As shown in FIG. 4, double sided tape 66 is used to connect the piezoelectric device 65 to the electrostatic pad 55.

Incorporation of the piezoelectric device with the electrostatic pad provides for both ultrasonic cleaning as well as electrostatic cleaning. Collectively, these cleaning techniques can remove a broader range and/or type of particles on the microstructured adhesive. Embodiments of this invention can include a piezoelectric device with a first and second resonant modes that are close together and a second mode (or a further mode) that results in a high enough displacement for cleaning. Embodiments of this invention can also further include an inter-digital piezoelectric device that matches the geometry of the current electrode designs.

The piezoelectric device can be used for and/or provides additional benefits beyond dust mitigation. In embodiments of this invention, the piezoelectric element is used to facilitate detachment of a substrate from the adhesive. The piezoelectric can also be used as a loadcell that can both detect contact of the adhesive to a substrate and the preload.

Figure 5:
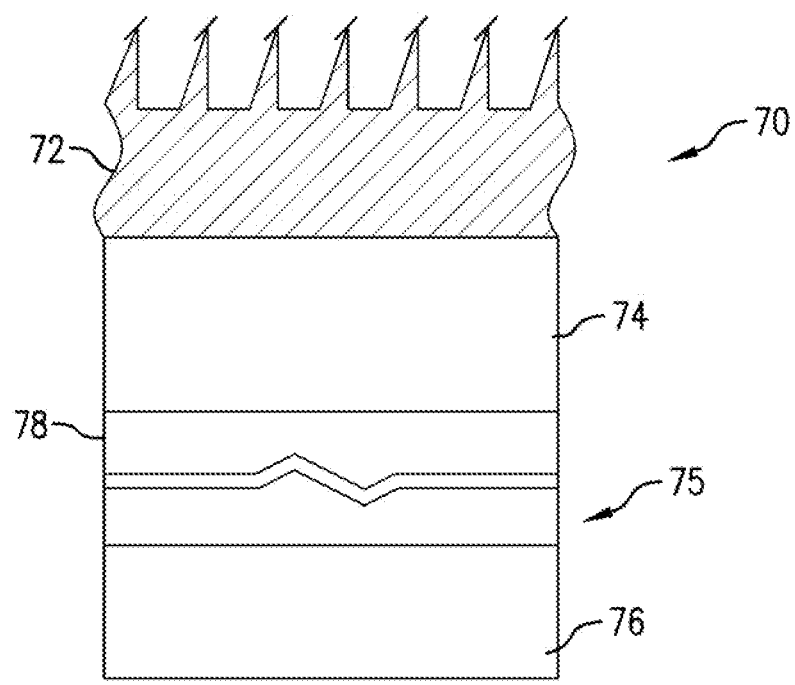
FIG. 5 shows a sectional view of an adhesive composite apparatus including a microstructured adhesive in combination with a piezoelectric device, according to one embodiment of this invention.

FIG. 5 shows an adhesive composite 70 including a microstructured adhesive 72 in combination with a piezoelectric device 75. The piezoelectric device includes a piezoelectric element 76 and a stainless steel membrane 78. Double sided tape layer 74 secures the piezoelectric device 75 to the microstructured adhesive 72.

Figure 6:
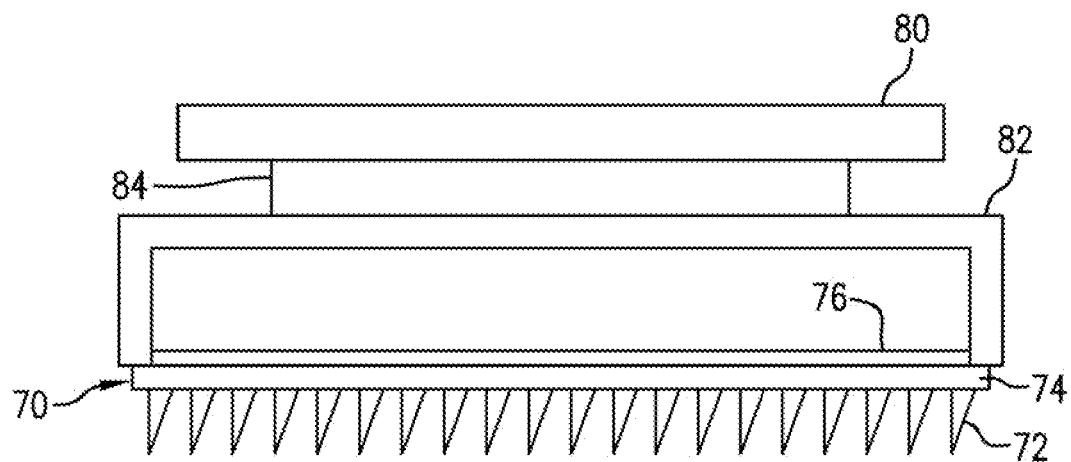
FIG. 6 shows the adhesive apparatus of FIG. 5 on a robotic manipulator, according to one embodiment of this invention.

FIG. 6 shows the adhesive composite 70 on a robotic manipulator 80. An acrylic sheet 82 secures the adhesive composite 70, and the acrylic sheet 82 is connected to a robotic manipulator 80 by an intermediate foam layer 84.

Figure 7:
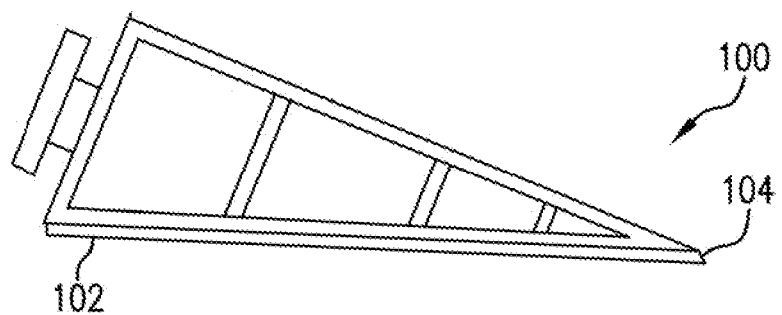
FIG. 7 shows a robotic gripper finger, according to one embodiment of this invention.

The adhesive materials and composites of this invention are particularly useful in robotics, such as for adhesion to a surface and/or gripping an object. Embodiments of the invention include at least one soft adaptive gripper finger that can be fabricated with flexible material (e.g., bendable about the object upon contact) by methods like 3D printing or molding. FIG. 7 shows an example of such soft gripper finger 100. Gripper finger 100 includes an adhesive according to any of the above embodiments attached directly or indirectly onto the surface of the gripper finger 100. In FIG. 7 an adhesive pad 102 is attached to the contact surface of the soft gripper finger. A resilient material, for example silicone foam 104, can be used between the adhesive 102 and the contact surface of the soft gripper finger 100 to make the adhesives more adaptive to object's shape. Double-sided tape can be used to attach the silicone foam to the soft gripper finger 100 and the adhesive 102.

Figure 8:
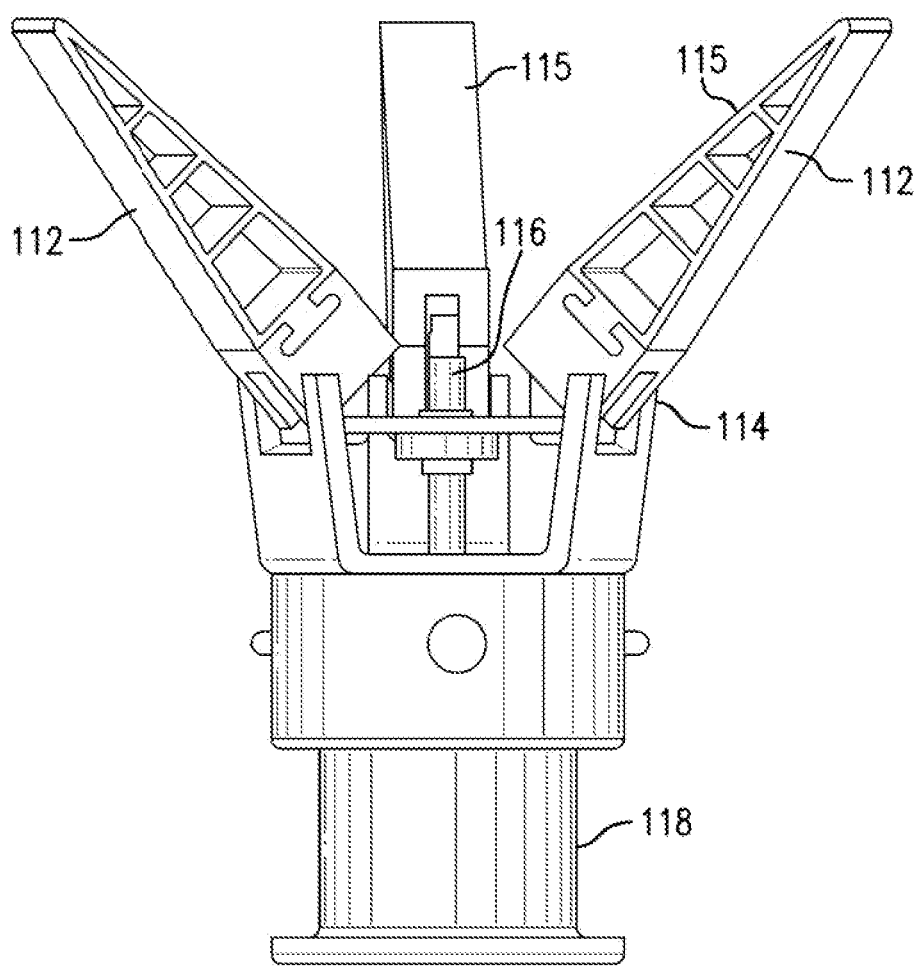
FIG. 8 shows a robotic gripper, according to one embodiment of this invention.
Figure 9:
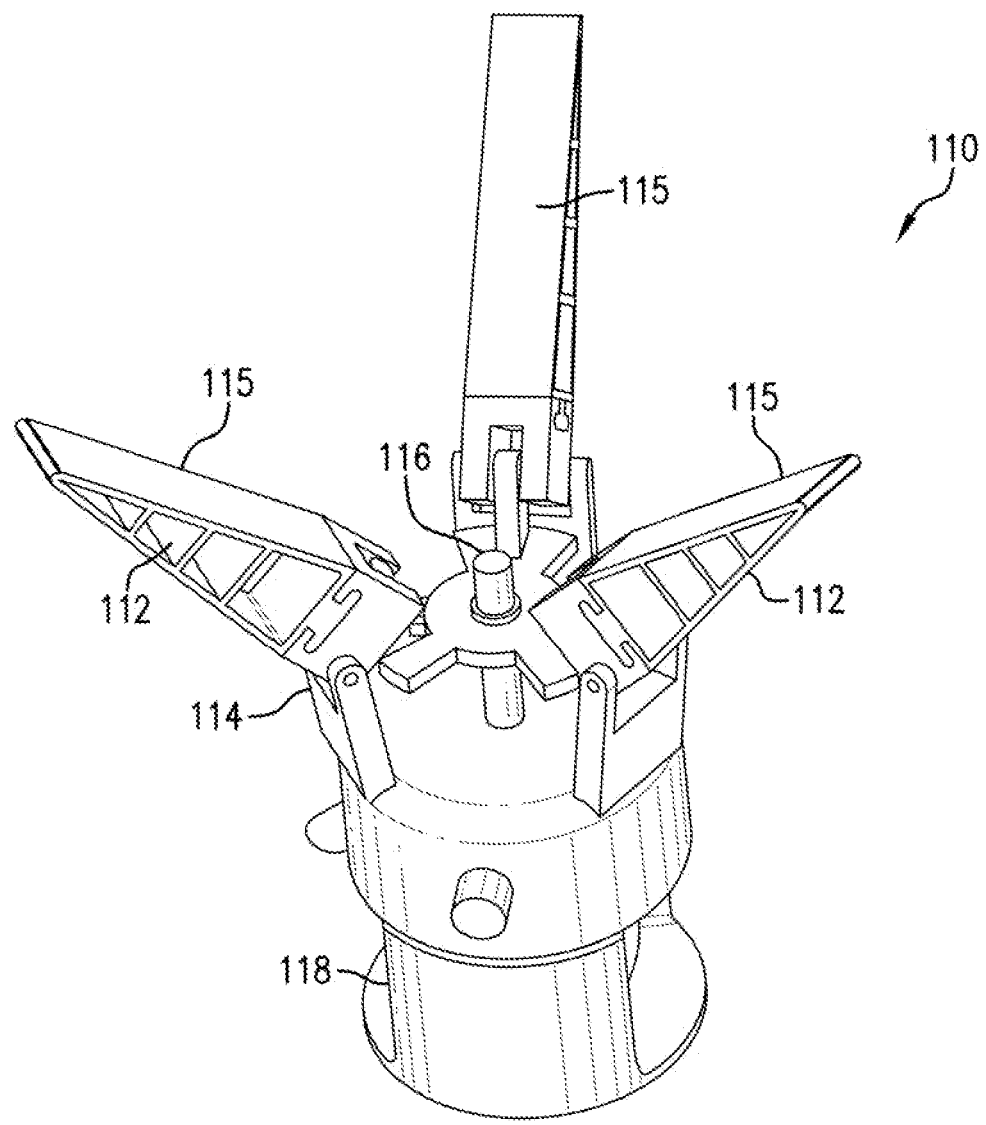
FIG. 9 is a perspective view of the robotic gripper of FIG. 8.

FIGS. 8 and 9 illustrate a robotic arm gripper 110 with three gripper fingers 112, each with an adhesive 115 according to embodiments of this invention. The three fingers 112 are connected to a finger holder 114. The finger holder 114 includes a hinge for each finger that allows the fingers to expand to open the gripper 110 and retract to close the gripper 110. The finger holder is connected to a motor shaft 116 that moves the finger holder 114 to move the fingers 112. The motor shaft 116 is connected to, for example a stepper motor 118.

Embodiments of the invention further include the methods and systems to control and actuate the gripper finger(s). One example of such methods and systems include a stepper motor with a lead screw, and a circuit to actuate the stepper motor. Such a system can control the gripper finger(s) with multiple different speeds and further can include a controller with, for example, a motor driver, Arduino pro mini, speed control potentiometer, reset button, and/or battery.

The present invention is described in further detail in connection with the following examples which illustrate or simulate various aspects involved in the practice of the invention. It is to be understood that all changes that come within the spirit of the invention are desired to be protected and thus the invention is not to be construed as limited by these examples.

EXAMPLES

1. Electrostatic Self-Cleaning

A. Fabrication

The fabrication process consisted of making two separate adhesive layers: the electrostatic adhesive and the microstructured adhesive, and then bonding them together.

1) Electrostatic Adhesive

To fabricate an electrostatic adhesive pad, a circular inter-digital electrode pattern was printed on toner transfer paper. The pattern was transferred by a laminator to the 9 µm-thick copper side of a 25 µm-thick Kapton sheet. The portion of the copper not covered by the ink was removed by etching the sheet in a ferric chloride bath for approximately 15 min. After etching, the ink covering the electrode pattern wax removed with acetone and cleaned with isopropyl alcohol. The result was a circular electrode pattern with 400 µm wide electrodes and a 600 µm gap between adjacent electrodes on a Kapton base. To insulate the electrodes, a layer of DYMAX Multi-Cure 9-20557 resin was painted onto the surface. The resin was degassed in a vacuum chamber and another layer of Kapton was placed on top of the resin. A 500 g cylindrical weight was rolled across the pad to remove air bubbles and create a uniformly thick resin layer. The resin was cured in an oven at 100° C. for 2 h. After curing, the added Kapton layer was peeled off, leaving the flat cured resin surface.

2) Gecko-Like Adhesive

Figure 10:
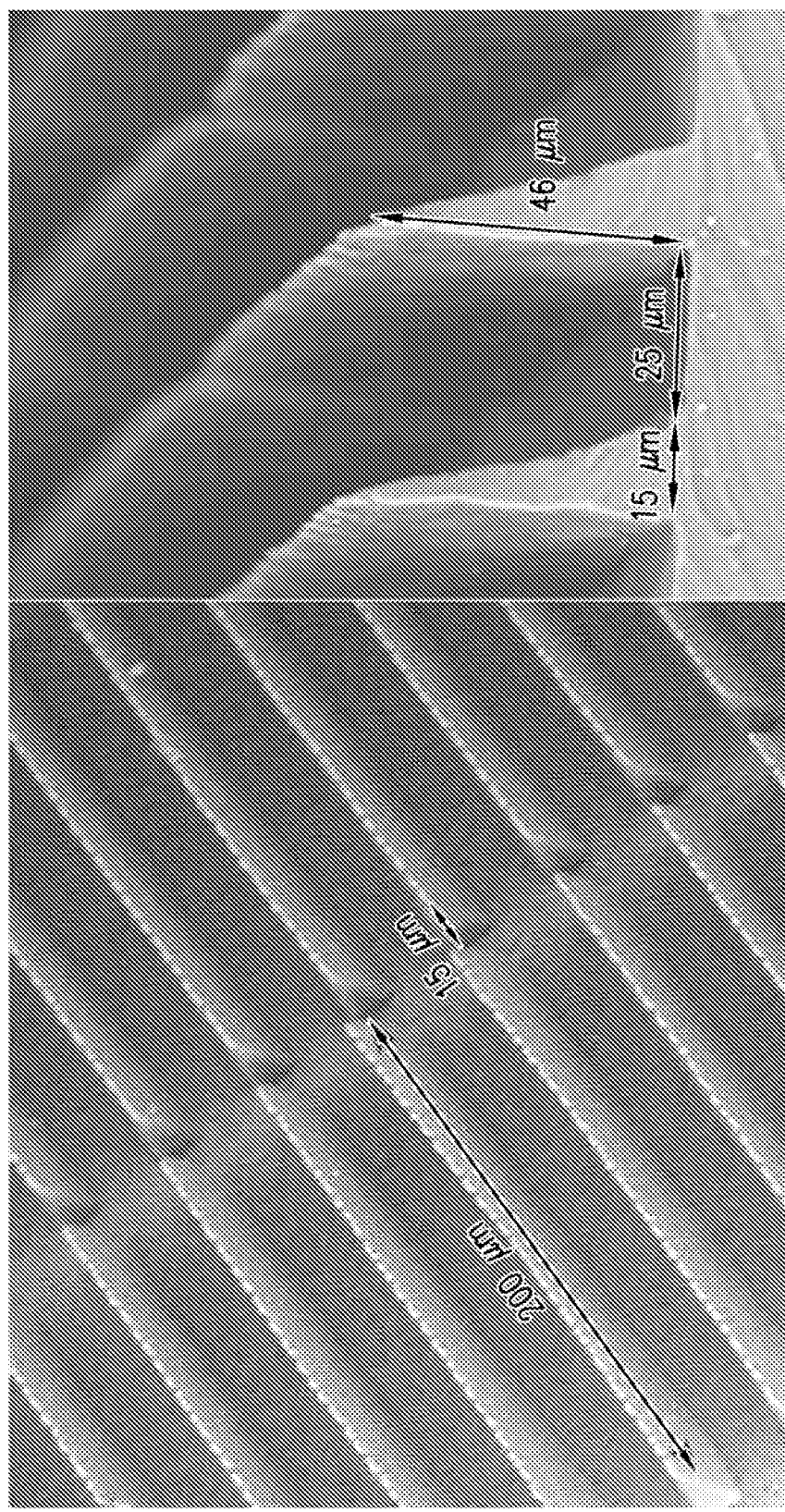
FIG. 10 includes SEM photographs of a microstructured adhesive, according to one embodiment of this invention.

To fabricate the gecko-like adhesive, Sylgard 170 (Dow Corning) was prepared based on the manufacturer's specifications. It was subsequently degassed in a vacuum chamber until all of the air bubbles were removed. To have a flat thin film on the surface of a negative wax mold of directional gecko-like adhesive wedges, the degassed Sylgard 170 was poured onto the mold and spun at 800 rpm in a spin-coating machine. The mold produced an adhesive with triangular wedges that were 15 µm at the base, 46 µm tall, and 200 µm wide (See FIG. 10). The additional Sylgard 170 material that comprised the base of the wedges was 65 µm thick. The adhesive on the mold is cured in an oven at 60° C. for 2 h.

Double sided tape (3M, #91022, app. 50 μm thick) was used to detach the microstructured adhesive from the wax mold and the adhesive was cured once more at 150° C. for 30 min. To combine the adhesive and the electrostatic pad, the double sided tape was placed on the electrostatic pad. The same tape was used to bond an unimorph piezoelectric device to the adhesive (see FIG. 4).

B. Experimental Test Platforms

Three different sets of equipment were used for electrostatic cleaning, ultrasonic cleaning, and shear stress tests. The electrostatic cleaning platform consisted of a PC with Labview 2013 v13.01f2 and a data acquisition card (National Instrument USB-6211) that generated a two-phase square wave with a 180° phase differential at 5 Hz for 30 s. The wave was amplified to 3 kV peak-to-peak with two high voltage amplifiers (Ultra Volt, 5HVA24-BP1-F).

The ultrasonic cleaning setup utilized a function generator (Keysight 33500 B series) and a high frequency linear amplifier (Piezo System Inc., model EPA-104) to sweep a 160 V peak-to-peak square wave from 20.5 kHz to 23.5 kHz frequency over 30 s. This signal is applied to a radial vibration mode unimorph piezoelectric (Stem-INC, SMUN15MT19F22111) with a resonant frequency of 22 kHz, φ19 mm stainless steel backing, and φ14 mm ceramic piezo element.

Shear stress was measured with a PC running Labview, a data acquisition card, a 6-DOF force-torque sensor (JR3), a pneumatic air slide, a variable pressure regulator.

C. Testing Procedure

To evaluate the cleaning efficiency, three tests were performed: image analysis, shear stress, and normal stress.

1) Image Analysis

The image analysis test counted the number of particles on the pads before and after cleaning to quantify the effect of particle size on cleaning efficiency. As a proxy for dust, three sizes of glass beads (Crystal Mark) were tested. Particles were filtered in No. 270, No. 200, No. 170, and No. 140 sieves such that the resulting particles were sorted into three diameter ranges: 53-75 μm, 75-90 μm, and 90-106 μm. Image analysis tests were performed using three φ19 mm adhesive pad samples that covered the entire circular piezoelectric device and electrostatic elements. Prior to applying the particles to the adhesive, the adhesive was cleaned with isopropyl alcohol and dried with pressurized air to remove any other contaminants. To ensure there was only one uniform layer of glass beads on the surface of the adhesive pad, the beads were poured onto the pad from a height of approximately 3 cm and excess beads were removed by gently shaking the pad. To examine the surface of the pad, a microscope with 5× magnification was used. A camera attached to the microscope took 18 MP photographs at ten locations on each sample before and after running each cleaning process for each of the three particle size ranges. Cleaning efficiency, defined as:

$$CE \equiv \frac{N_1 - N_2}{N_1} \cdot 100 \qquad (1)$$

where $N_1$ and $N_2$ are the number of particles in the frame before and after the cleaning process, respectively, was assessed for each image. Particles were identified with the Matlab function 'imfindcircles,' which uses a circular Hough transform to detect edges coupled with visual verification (i.e., counting by hand).

2) Shear Stress

The image processing tests measured the effectiveness of the dust mitigation techniques for a range of glass particles. However, to understand cleaning in real-world conditions, the shear stress of the pads was also tested after being subjected to a dusty tabletop in the lab.

First, the pads were cleaned with isopropyl alcohol and dried with pressurized air to clean the surface of any contaminant. Next, the flat glass substrate of the shear stress performance setup was cleaned with isopropyl alcohol. The adhesive pad was contaminated by contact with a dusty table, then mounted on the test setup slider and put into contact with the substrate. A weight placed on top of the pad applies 10 kPa normal pressure to facilitate the engagement of the microstructured adhesive with the substrate, ensure contact between the pad and the substrate, and reduce the particle rolling that can cause error in the shear test results (i.e., particles can act like ball bearings). The shear stress test was repeated five times for each dusty pad.

The pad was removed and cleaned (particle-side down) for 30 s using one of the three cleaning processes: electrostatic cleaning, ultrasonic cleaning, or both. The substrate was cleaned with isopropyl alcohol and the cleaned pad was again put in contact with the substrate for testing. Finally, the pad was washed with isopropyl alcohol and dried with pressurized air before repeating the process.

3) Normal Stress

To test adhesion recovery in the normal direction, the pads were tested on a robotic gripper. The Schunk gripper (EGP 40-N-N-B) acts through a mechanism to load three adhesive pads in shear. Since the microstructured adhesives are directional, applying a shear load creates allowable normal adhesion. The gripper was tested five times for each sample. The flat glass substrate was cleaned with isopropyl alcohol prior to each test. A normal pre-load of the weight of the gripper plus a manually applied 13 kPa was used. Once engaged, the gripper was manually pulled up from the substrate until the gripper detached from the substrate. The maximum normal stress achieved by the gripper was recorded in Lab VIEW.

Observing no shear or normal stress recovery after running the same test for pads not subjected to any cleaning ensures that the recovery is solely due to a cleaning procedure.

D. Image Analysis of Particle Removal

Electrostatic cleaning provided a nearly uniform reduction of particles across the pad save a slight difference in the gaps between electrodes and above the electrodes themselves (the gaps had a higher cleaning efficiency). In contrast, ultrasonic cleaning showed a distinct 'ring' of particles that could not be removed from the adhesive. This ring appeared at the edge of the piezo ceramic (≅φ14 mm, which undergoes the least amount of displacement, as verified by a Comsol simulation). Thus, the ultrasonic cleaning efficiency is evaluated for both the 'ring' and the remainder of the adhesive pad separately. For the FEA simulation, the solid mechanics and electrostatics components of Comsol Multiphysics 5.3 were used. The piezo was modeled as lead zirconate titanate (PZT-5J), and the steel membrane was evaluated using a linear elastic model.

Figure 11:
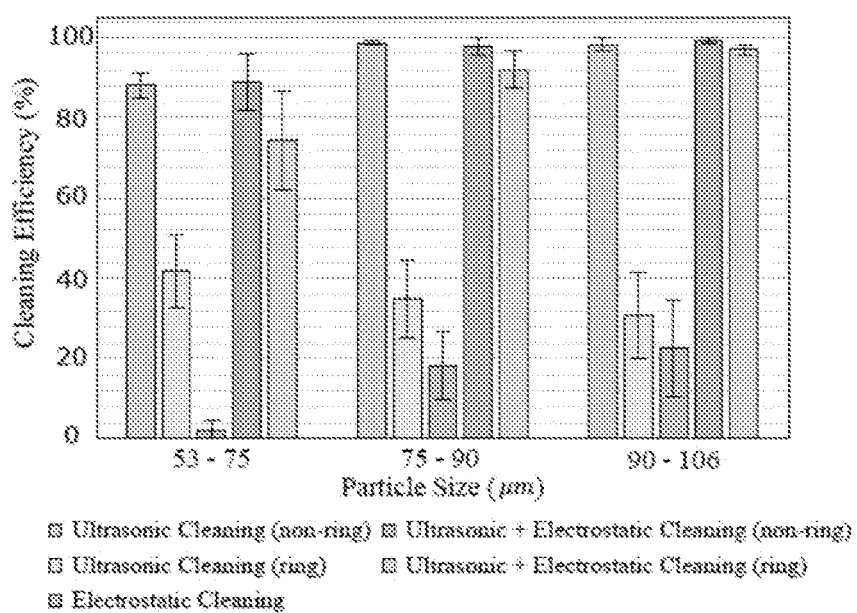
FIG. 11 summarizes cleaning efficiency for ultrasonic, electrostatic and ultra-sonic/electrostatic cleaning when microstructured adhesives are contaminated with 53-75 μm, 75-90 μm, and 90-106 μm glass beads. The error-bars show standard deviation. For one-way analysis of variance with the cleaning method as the independent variable, $F=16.07$ and $P=0.00018$ for 90-106 μm glass beads, $F=19.89$ and $P=0.00006$ for 75-90 μm glass beads, and $F=37.01$ and $P<0.00001$ for 53-75 μm glass beads.

The average cleaning efficiency, consisting of the data from three sample pads for each cleaning method and particle size, is shown in FIG. 11. Ultrasonic cleaning resulted in a much higher cleaning efficiency than electrostatic cleaning, even in the ring portion, and especially for the smallest particle size range. The ineffectiveness of the electrostatic cleaning was most likely due to the fact that the electrode gap and thickness were optimized to mitigate particles only in the largest size range, 90-106 µm. Combining electrostatic cleaning and ultrasonic cleaning resulted in a higher overall cleaning efficiency, and the electrostatic cleaning helped to increase the cleaning efficiency in the 'ring'.

The best overall cleaning occurred when the largest particle size range was cleaned by both electrostatic and ultrasonic cleaning, 99% for the area outside of the ring and 97% for the ring. By adding electrostatic to ultrasonic cleaning, the cleaning efficiency is improved by approximately 33% for 53-75 µm particles, 58% for 75-90 µm particles, and 67% for 90-106 µm particles for the 'ring' of particles left by ultrasonic cleaning. Note that due to low displacement at other frequencies, running the piezoelectric at other frequencies does not help to alleviate the ring issue.

E. Shear Stress Recovery

Figure 12:
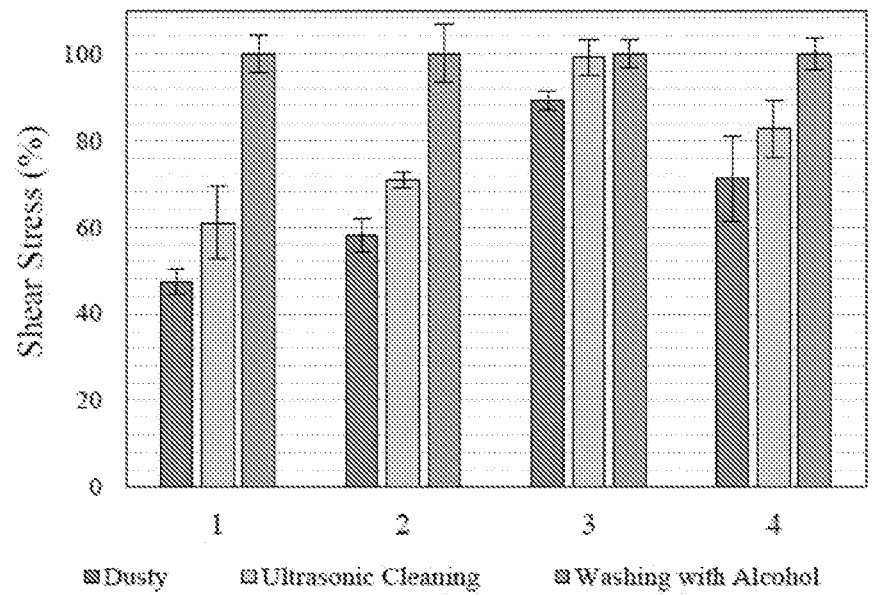
FIG. 12 summarizes ultrasonic cleaning shear stress recovery for microstructured adhesives contaminated through contact with a dusty table. One-way analysis of variance for dusty, cleaned, and washed pads, $F=5.89$ and $P=0.02308$.
Figure 13:
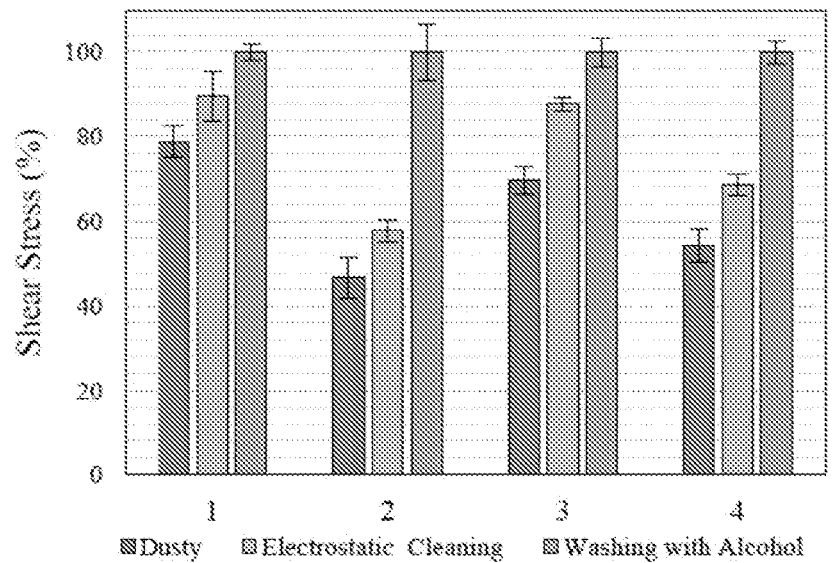
FIG. 13 summarizes electrostatic cleaning shear stress recovery for microstructured adhesives contaminated through contact with a dusty table. One-way analysis of variance for dusty, cleaned, and washed pads, $F=9.57$ and $P=0.00591$.
Figure 14:
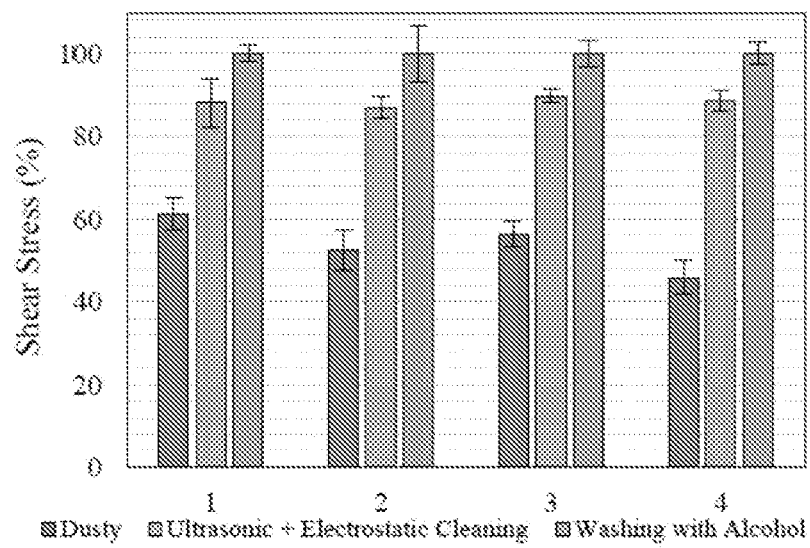
FIG. 14 summarizes electrostatic+ultrasonic shear stress recovery for microstructured adhesives contaminated through contact with a dusty table. One-way analysis of variance for dusty, cleaned, and washed pads, $F=167.73$ and $P<0.00001$ FIG. 15 summarizes shear stress recovery for ultrasonic, electrostatic and ultrasonic+electrostatic cleaning when microstructured adhesives contaminated with real dust by contact with a dusty table. One-way analysis of variance yields $F=32.19$ and $P=0.00008$.

For the shear stress recovery test, four samples were tested with each cleaning method. Because the pads were contaminated through contact with a dusty table, the contamination level for each test was not the same. Therefore, the drop in shear stress after contaminating a pad is not the same for all tests. The results are analyzed in terms of shear stress recovery: how much shear stress capability a pad cleaned with electrostatic, ultrasonic, or combination cleaning has compared to the same pad cleaned with isopropyl alcohol. FIGS. 12, 13, and 14 show that despite each test beginning with a different contamination level, the shear stress recovery percentage were similar for all tests performed with the same cleaning method.

Figure 15:
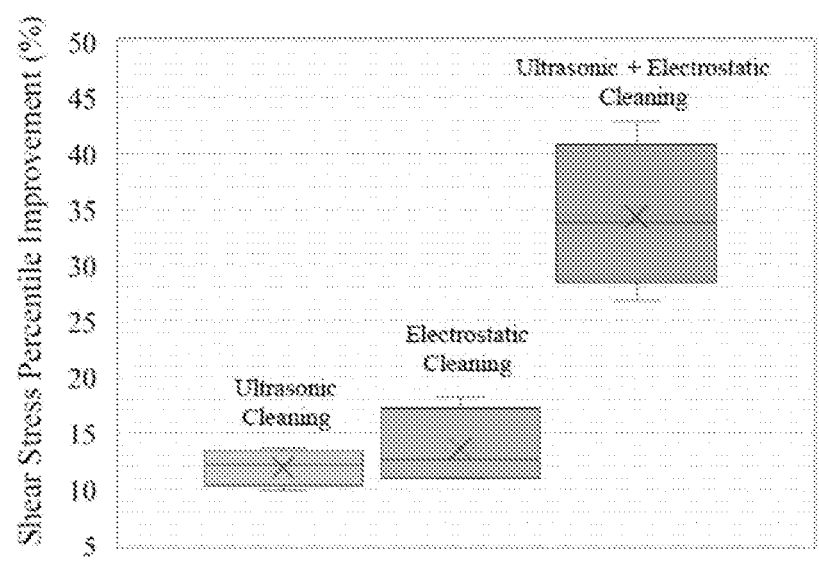

Both electrostatic-only and ultrasonic-only cleaning yielded approximately 12% recovery in shear stress (see FIG. 15). Combining the two methods provided approximately 34% recovery in shear stress, nearly three times higher than either method used separately. However, the real-world dust proved to be more difficult to recover from than the glass beads. This will obviously be highly dependent on the specific makeup of the dust in the environment.

F. Normal Stress Recovery in a Gripper

Figure 16:
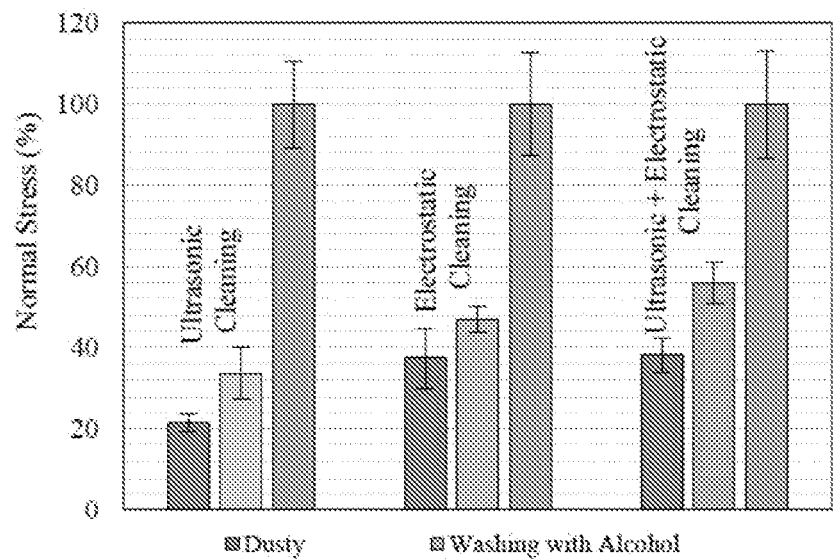
FIG. 16 summarizes normal stress recovery for ultrasonic, electrostatic and ultrasonic+electrostatic cleaning when microstructured adhesives contaminated with real dust by contact with a dusty table. One-way analysis of variance for ultrasonic cleaning, $F=59.81$; for electrostatic cleaning, $F=52.29$; and for ultrasonic+electrostatic cleaning, $F=131.63$. $P<0.00001$ for all methods.

Finally, to gauge the normal stress recovery of the adhesive pad after the cleaning process, the adhesive pads were attached to the aforementioned gripper for testing. The results are shown in FIG. 16. Again, results were reported in terms of adhesion pressure recovery. The ultrasonic cleaning process resulted in a 12% recovery compared to the pad cleaned with alcohol. In comparison, the electrostatic cleaning process yielded a 10% recovery. Despite the low cleaning efficiency for glass particles, electrostatic cleaning is about as effective as ultrasonic cleaning for pads contaminated by real dust. The best normal stress recovery of 18% came from combining both ultrasonic and electrostatic cleaning.

2. Controllable Adhesion, Cleaning, and Sensing Using Piezoelectric

This example describes a microstructure adhesive bonded with a unimorph piezoelectric device, and uses thereof.

A. Adhesive Fabrication

Adhesive fabrication consisted of two processes: casting PDMS in a mold to generate the microwedges and post-treating the microstructured elements to create a smooth cap on the wedges' tips.

To fabricate the microstructure adhesives, Sylgard 184 (Dow Corning) part A and B were mixed according to the manufacturer's specifications and degassed in a vacuum chamber until no bubbles appear. The mixture was poured (See FIG. 2A) and spun at 1200 rpm for 40 s on the surface of a negative wax mold of the directional microstructured adhesive wedges (See FIG. 2B). The mixture was degassed again, while on the mold, and cured in an oven at 60° C. for 2 h. After curing, double sided tape with 100 µm thickness (3M) was used to detach the microstructure adhesives from the mold (See FIG. 2C).

For the post-treatment process, Smooth Sil 960 was prepared based on the manufacturer's specifications. 50 wt % Heptane is added, and the resulting mixture was spun on a clean glass plate at 5000 rpm for 45 s to create a thin, uniform layer of polymer. The glass plate with the thin layer of Smooth Sil 960 was brought into contact with the microstructures (See FIG. 2D). After carefully removing that layer of glass, a second sheet of clean glass along with a weight was placed on the microstructures to apply a 0.5 kPa load (See FIG. 2E). The sample was cured in an oven at 60° C. for 30 min and then at 120° C. for 30 min. A cross-sectional schematic of the final structure is shown in FIG. 2F.

B. Gripper Fabrication

The resulting adhesive was attached to a piezoelectric (unimorph StemINC-SMUN15MT19F22111, with a resonant frequency of 22 kHz, φ19 mm stainless steel membrane, and φ14 mm ceramic element) with 100 µm-thick double sided tape (See FIG. 5). The piezoelectric device is glued to an acrylic sheet. Foam is added between the acrylic sheet and the end of a robotic manipulator, for example, to ensure proper alignment of the adhesive with a substrate (See FIG. 6).

C. Experimental Test Platforms

Adhesion was measured using an Instron-5542 tensile tester and static 500 N load cell. The piezoelectric was controlled with a function generator (Keysight 33500 B series) and high frequency linear amplifier (Piezo System Inc., model EPA-104). This setup was used to sweep a 160 V peak-to-peak square wave from 21.5 kHz to 23.5 kHz.

D. Testing Procedures

Four tests were performed. The first studied the effect of the piezoelectric on controlling adhesion, specifically using the piezoelectric element to turn the adhesive 'off'. The second and third investigated cleaning efficiency on uniform glass beads and real-world dust, respectively. The fourth characterized the use of the piezoelectric as a force sensor.

1) Controllable Adhesion

To study the capability of the ultrasonic surface vibration method to control the adhesion of microstructured adhesives (i.e., to turn the adhesive off), adhesion tests were performed at varying preloads on carbon fiber/epoxy laminate, glass, and ceramic tile substrates.

The maximum adhesion, $A_{max}$ was determined by loading the adhesive to a given preload and then pulling off in the opposite direction until the substrate releases from the adhesive. Loading and unloading speeds for all tests were 5 mm min$^{-1}$.

Given $A_{max}$, there exists some adhesion pressure that corresponds to the lightest load that a gripper can both pick up and release. This was defined as the minimum required adhesion, $A_{min}$. If the load was less than the minimum required adhesion, the gripper was able to lift the load, but unable to release it with the piezoelectric. Thus, the operating range of the adhesive lies between $A_{min}$ and $A_{max}$, which are both dependent on both the substrate material and preload.

Figure 17:
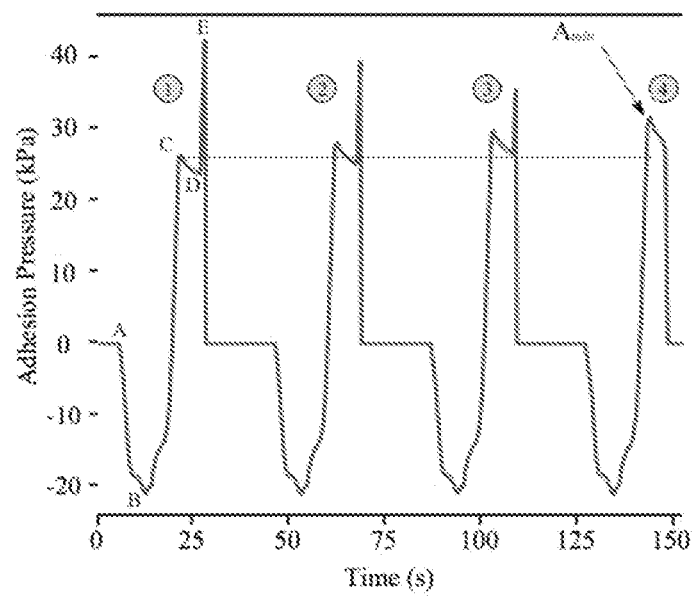
FIG. 17 summarizes a test procedure to find $A_{min}$, the minimum required adhesion such that the piezoelectric can guarantee that an object can be released from the adhesive (i.e., the adhesive of this invention can be turned off).

FIG. 17 illustrates the method used to find $A_{min}$. The substrate was preloaded to a prescribed value (see FIG. 17, point B) and then pulled in the opposite direction (adhesion) until some predetermined value (see FIG. 17, point C). At that point, the piezoelectric was swept for 1 s with a 160 V peak-peak square wave from 21.5 kHz to 23.5 kHz. After a 5 s pause (see FIG. 17, point D), the adhesive was again pulled from the substrate. If the point at which the adhesive released from the substrate (see FIG. 17, point E) is greater than point C, then the test was repeated with a higher prescribed value for point C. This is shown in FIG. 17 where the prescribed point (C) is increased over four successive trials. $A_{min}$ is found in the fourth trial. Additional tests were performed and confirmed that the 5 s pause does not affect $A_{max}$.

2) Dust Mitigation—Glass Bead Cleaning Efficiency

Two tests were performed to evaluate dust mitigation performance. The first used uniform glass beads (Crystal Mark) to maintain consistency among tests. The second used dust from a lab environment, which is highly environment dependent, but more accurately tests real-world conditions.

No. 200, No. 170, and No. 140 sieves were used to filter glass beads particles into φ75-90 μm and φ90-106 μm ranges. Before putting particles on samples, the adhesives were cleaned with isopropyl alcohol and pressurized air. The particles were poured onto the samples from an approximately 3 cm height. To ensure that only one uniform layer of particles lay on the adhesive, the samples were gently shaken.

A 10× microscope with an 18 MP camera took photos before and after cleaning such that the cleaning efficiency, CE could be determined using Equation 1 (above). Matlab function 'imfindcircles', which uses a circular Hough transform to detect edges was used to count the number of particles in each frame. Finally, all frames were visually verified.

3) Dust Mitigation—Real-World Dust Cleaning Efficiency

Dust mitigation was also measured after the microstructured adhesives were contaminated through contact with a dusty table in the lab. Because of the dust's non-uniform geometry, visually counting dust particles before and after cleaning is not feasible. Thus, after contaminating samples by contact with a dusty table, they were mounted on an Instron-5542 tensile tester, and adhesion tests were run for each sample five times. This had the added benefit of measuring the level of adhesion before and after the piezoelectric cleaning process and not just the number of particles removed. Engaging speed and preload were 5 mm min$^{-1}$ and 2 N (corresponding to 7 kPa), respectively. Then, the ultrasonic cleaning process was run for 30 s. A glass substrate was used for all tests.

4) Sensing

Use of the piezoelectric device as a force/contact sensor was a function of the preload and approach speed. As such, the output voltage was measured for 2 N, 4 N, and 6 N preloads at 5 mm min$^{-1}$, 20 mm min$^{-1}$, and 40 mm min$^{-1}$.

E. Controlling Adhesion (On/Off)

Figure 18:
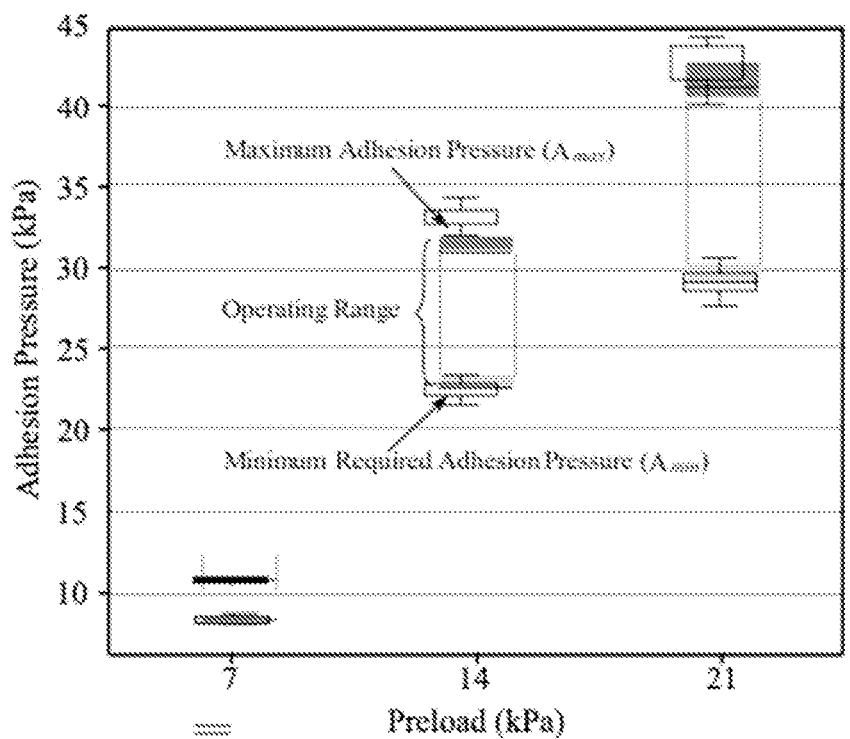
FIG. 18 summarizes the operating range of a gripper for a carbon fiber/epoxy laminate substrate as a function of preload for one embodiment of this invention.
Figure 19:
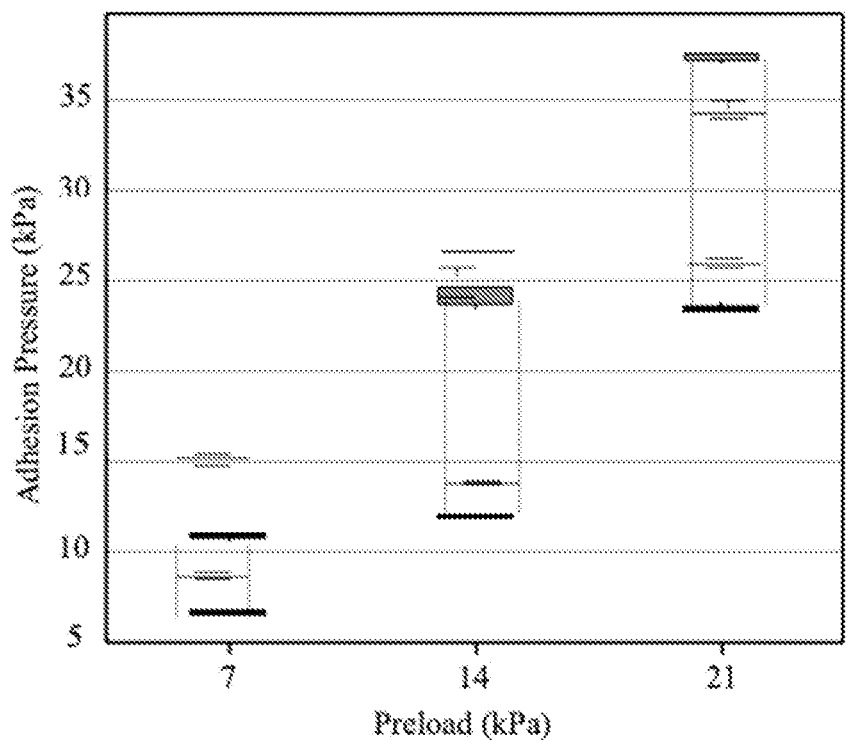
FIG. 19 summarizes the operating range of the gripper for a glass substrate as a function of preload for one embodiment of this invention.
Figure 20:
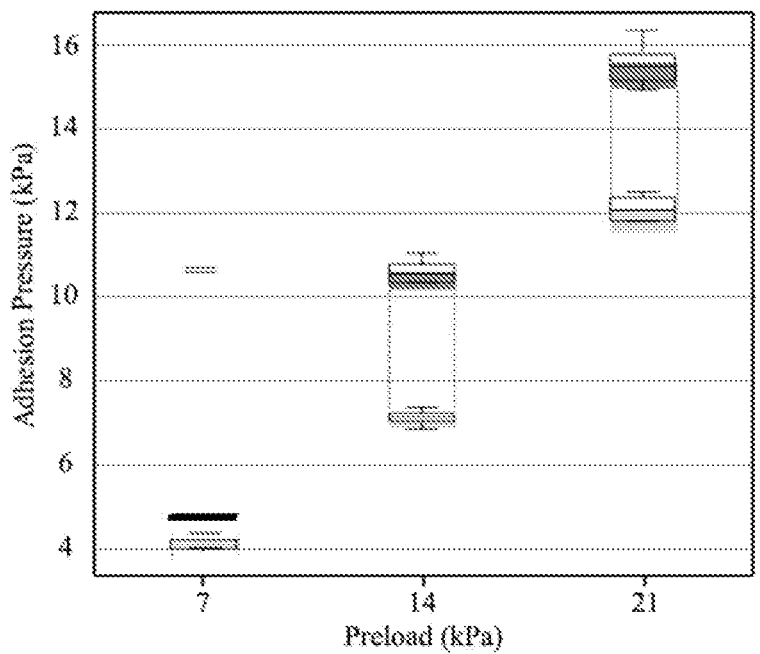
FIG. 20 summarizes the operating range of the gripper for a ceramic tile substrate as a function of preload for one embodiment of this invention.

FIGS. 18-20 show the results of the adhesion tests for 7 kPa, 14 kPa, and 21 kPa preloads for carbon fiber/epoxy laminate, glass, and ceramic tile substrates, respectively. In these graphs, for each preload, the upper box plot indicates $A_{max}$. The lower box plot indicates $A_{min}$. The operating range lies between those two values.

For example, for a gripper to pick an object up as well as to use ultrasonic surface vibration as a means to control adhesion in a gripper, the detachment pressure due to an object's mass should lie somewhere within the operating range. A higher preload results in a higher $A_{max}$ across all materials and generally a larger operating range.

The adhesives generate a higher $A_{max}$ on the carbon fiber/epoxy laminate and glass compared to the ceramic tile for a given preload, which is mainly due to a higher surface roughness in the ceramic tile.

F. Cleaning Efficiency

Figure 21:
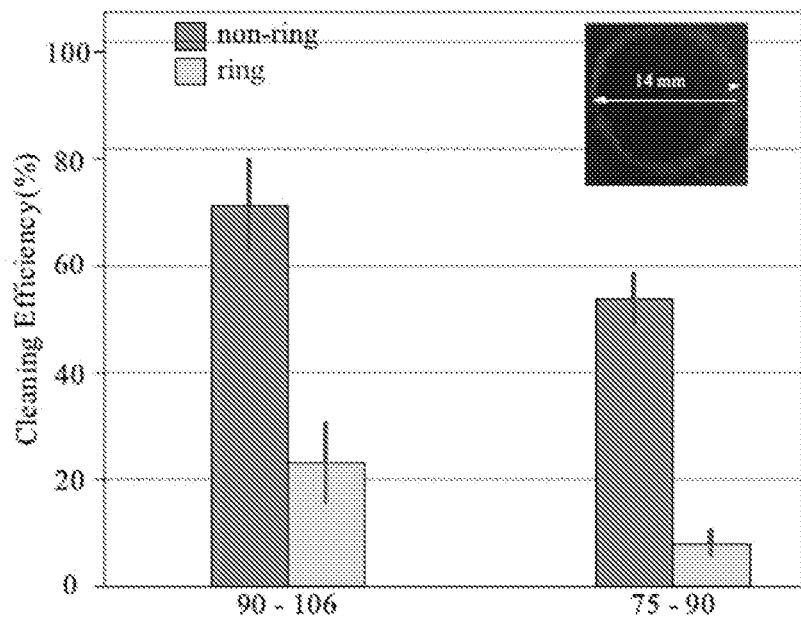
FIG. 21 shows cleaning efficiency for two different particle sizes. 'Ring' indicates a radial node in the piezoelectric element (top right picture).

FIG. 21 shows average cleaning efficiency for 90-106 μm and 75-90 μm glass bead particles. Error bars indicate the standard deviation. At the edge of piezoelectric device (labeled 'ring'), the cleaning efficiency is lower due to a vibration node. The cleaning efficiency was likely lower than expected from prior experiments due to the post treatment process, which increased the contact area between particles and the adhesive.

Figure 22:
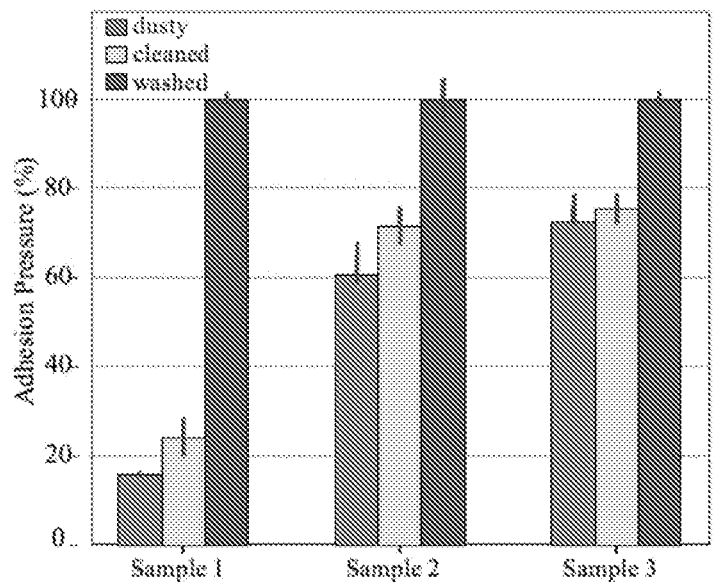
FIG. 22 summarizes adhesion recovery for samples contaminated with dust from a lab environment. Values are normalized against a pristine sample, labeled 'washed.'

FIG. 22 shows the adhesion recovery after ultrasonic cleaning for three samples contaminated with real dust. The results are normalized with respect to a fresh, pristine sample on a clean surface ('washed'). The contamination levels and recovery levels varied widely for each sample since contaminating microstructured adhesives through contact with a dusty table is a random phenomenon. Results may be improved by combining ultrasonic cleaning with electrostatic cleaning to create an adhesive that is practical for real world applications.

G. Sensing

Figure 23:
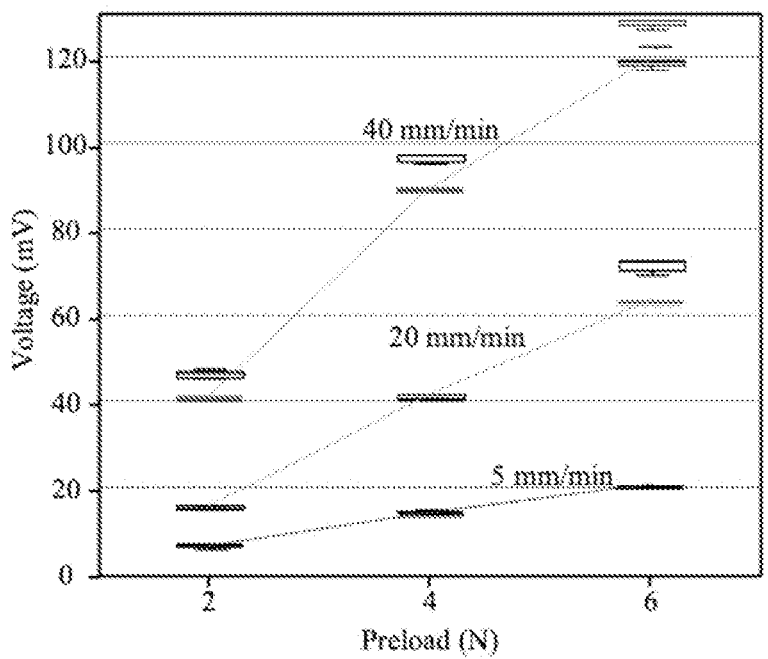
FIG. 23 shows an output voltage of piezoelectric device for 2 N, 4 N, and 6 N preloads with an engaging speed of 5 mm min$^{-1}$, 20 mm min$^{-1}$, and 40 mm min$^{-1}$.

FIG. 23 shows the output voltage of the piezoelectric device for 2 N, 4 N, and 6 N preloads with an engaging speed of 5 mm min$^{-1}$, 20 mm min$^{-1}$, and 40 mm min$^{-1}$. Output voltages were higher for higher engaging speeds. Also, by increasing the reload, output voltage increased. The results show a well-defined linear response indicating that the piezoelectric can perform well as a sensor.

The piezoelectric device, which was previously been shown to be effective at cleaning dust from a directional microstructured adhesive, is used here to control the adhesion in the gripper by serving as a release mechanism to turn the adhesive off. Further tests demonstrate the piezoelectric's effectiveness in dust mitigation. Finally, it was shown that the piezoelectric can be used as a force/contact sensor.

3. Finger Fabrication

To demonstrate the adhesives usefulness in robotic grippers, a Form 2 3D printer was used to print three fingers with flexible material (See FIG. 8). This finger design was inspired by the Festo FinGripper. Printed parts were washed in isopropyl alcohol and cured with Ultraviolet at 60° C., based on Formlabs manual instruction.

A. Electrostatic Pad

To fabricate an electrostatic dry adhesive pad, a 'comb', or 'inter-digital', electrode pattern was printed on toner transfer paper using a laser printer. A laminator transferred the ink to the 9 mm-thick copper side of a 25 mm thick Kapton sheet. Copper that was not coated with ink was removed by etching in a ferric chloride bath for approximately 15 min. Any remaining ink was removed with acetone and then cleaned with isopropyl alcohol. The result was a set of 400 mm wide electrodes with a 600 mm gap between adjacent electrodes (FIG. 6(a)). A thin, approximately 20 mm, layer of DYMAX Multi-Cure 9-20557 resin was painted onto the surface to insulate the electrodes. Another layer of LF7001 (Dupont) is added ($\approx$13 µm) to decrease the risk of a voltage short between electrodes. The coating of acrylic adhesive on one side of LF7001 reduced any sparking risk.

B. Gecko-Like Adhesive

To create gecko-like adhesive wedges, Sylgard 184 (Dow Corning) was prepared according to manufacturer's specification and degassed in a vacuum chamber at 30 inch Hg until no air bubbles appear. A spin-coating machine created a flat thin film of Sylgard 184 on the surface of a negative wax mold of the gecko-like adhesive wedges. The gecko-like adhesive consisted of triangular wedges 15 mm at the base, approximately 46 mm tall and 200 mm wide, with a spacing of 25 mm between each wedge.

C. Combination Electrostatic/Gecko-Like Adhesive

To combine the two parts, first, Dow Corning PR-1200 RTV Prime Coat Red was brushed on the surface of the LF7001 to create a bond between the LF7001 and microstructured adhesive. Second, the electrostatic pad was placed on the Sylgard 184 and a 50 g weight as rolled across the electrostatic pad to remove any air bubbles that may have been trapped between the electrostatic pad and Sylgard 184. This rolling process also helped create a uniform thickness in the gecko-like adhesive. Last, the gecko-like/electrostatic adhesive was cured in an oven at 60° C. for 2 hours followed by 150° C. for 30 min Note that due to the hand-made fabrication process, there is high variance in cleaning efficiency among different electrostatic/gecko-like adhesive pads. This variance comes from differences in the thickness of different layers and variations in the molds over time.

FIGS. 3A-C depict the electrode arrangement and signal connections for single, two and three-phase configurations when excited by square waves. The right side of the figures also shows the voltage waveforms and electrode states. For single-phase excitation, one set of electrodes was connected to the ground and the other to the signal's source, resulting in two possible states. For two-phase excitation, electrode sets were connected to signals 1808 out of phase, which also resulted in two possible states. For three-phase excitation, three sets of electrodes received signals with a 120 difference in phase. This resulted in six possible states.

D. Combining Electrostatic/Gecko-Like Adhesive and Soft Adaptive Finger

To make the adhesives more adaptive to objects' shape, resilient silicone foam with 3.175 mm thickness was used as a backing for electrostatic/gecko-like adhesives. 100 µm double-sided tape (3M) was used to attach foam to flexible fingers and adhesives.

E. Actuation Mechanism

A stepper motor (Bipolar, 200 Steps/Rev) with a 10 cm lead screw was used to actuate fingers. The gripper is represented in FIGS. 8 and 9. The three fingers were controllable at four different speeds, via a potentiometer.

F. Working Examples with Objects of Different Shapes, Sizes and Materials

The capability of this gripper to grip objects with different shapes, sizes and materials was evaluated. The gripper was able to grip, for example, a soccer ball, an inflated beach ball, a coffee cup, and a stapler. The gripper was shown to be a useful improvement for robotic applications, such as the Astrobee system of a free-flying robots to be deployed in the International Space Station (ISS) as a replacement to the successful Spheres program. For the aforementioned goals, the Astrobee needs a robotic arm with a gripper that not only perches onto surfaces in the space station and maintain specific positions for an extended period of time but also helps Astrobee to grab objects with different shapes and sizes.

A new soft, adaptive, self-cleaning, electrostatic/gecko-like adhesives gripper embodied by this invention can be applied on the robotic arm of the Astrobee. The gripper can grip an object of almost any shape, size, or material by using gecko-like adhesives and/or electrostatic adhesives. By using the electrostatic, it also has the ability of self-cleaning (make the gripper applicable for not clean environments). This gripper also consumes little to no power while Astrobee is perched or gripped an object.

Thus, the invention improved adhesive materials. The adhesive materials are useful for robotic and other applications for improved grip and grip control. The material composites and methods of this invention provide cleaning for microstructured adhesives during field use, improving grip while reducing down time.

The invention illustratively disclosed herein suitably may be practiced in the absence of any element, part, step, component, or ingredient which is not specifically disclosed herein.

While in the foregoing detailed description this invention has been described in relation to certain preferred embodiments thereof, and many details have been set forth for purposes of illustration, it will be apparent to those skilled in the art that the invention is susceptible to additional embodiments and that certain of the details described herein can be varied considerably without departing from the basic principles of the invention.

What is claimed is:

1. An adhesive apparatus, comprising an electrostatic adhesive configured to attach to a contact surface and provide adhesion between the contact surface and an object, the electrostatic adhesive including a microstructured adhesive disposed and layered over an electrode and/or a piezoelectric element, wherein the electrode and/or the piezoelectric element is disposed between the microstructured adhesive and the contact surface.

2. The apparatus of claim 1, further comprising:
a gripper finger formed of a flexible material and including a grip surface; and
an adhesive pad on the grip surface, the adhesive pad comprising the electrostatic adhesive.

3. The apparatus of claim 1, wherein the microstructured adhesive comprises a plurality of triangular wedges.

4. The apparatus of claim 1, further comprising a dielectric and/or an insulator disposed between the electrode and the microstructured adhesive.

5. The apparatus of claim 1, further comprising a layer of electrodes arranged in a pattern and with signal connections configured to provide a plurality of different controllable electrostatic field configurations.

6. The apparatus of claim 1, further comprising the piezoelectric element in combination with the microstructured adhesive.

7. The apparatus of claim 6, wherein the piezoelectric element is adapted to electrostatically repel dust from the adhesive, release the adhesive, and/or act as a force/contact sensor for the gripper.

8. A method of operating the electrostatic adhesive according to claim 1, comprising a step of applying to the adhesive an electrostatic field and/or ultrasonic vibration, configured for cleaning the adhesive, releasing the adhesive, and/or sensing a load on the adhesive.

9. The method of claim 8, wherein electrostatic forces and/or ultrasonic vibrations repel dust particles adhered to the adhesive.

10. The method of claim 8, further comprising cleaning the adhesive with ultrasonic vibration from a piezoelectric device.

11. The method of claim 8, further comprising changing an electrostatic field configuration with and across a layer of electrodes arranged in a pattern.

12. The method of claim 8, further comprising changing the electrostatic field between resonant modes to provide a displacement for cleaning.

13. The method of claim 8, further comprising removing an electrostatic force from the adhesive to release the adhesive.

14. The method of claim 8, further comprising determining a load of the adhesive from an output voltage of a piezoelectric device in combination with the adhesive.

15. The apparatus of claim 2, further comprising a foam layer disposed between the adhesive pad and the grip surface.

16. The apparatus of claim 2, further comprising:
a hinged finger joint at a base end of the gripper finger; and
a motor connected to the gripper finger and configured to move the gripper finger about the hinged finger joint, wherein the motor comprises a stepper shaft disposed between two or more gripper fingers.

17. The apparatus of claim 2, further comprising:
a finger holder including or connected to two hinged finger joints each connected to one of the gripper finger or a second gripper finger; and
a motor connected to the finger holder and configured to simultaneously move the gripper finger and the second gripper finger, each about a corresponding one of the hinged finger joints.

18. The apparatus of claim 3, wherein each of the plurality of triangular wedges comprises a smooth cap tip.

19. The apparatus of claim 1, further comprising:
an array of electrodes under the microstructured adhesive; and
a piezoelectric element on an opposite side of the array of electrodes from the microstructured adhesive.

20. The apparatus of claim 19, further comprising a dielectric layer between the array of electrodes and the piezoelectric element.

21. The apparatus of claim 1, wherein the electrode and/or the piezoelectric element is adapted to electrostatically and/or ultrasonically clean the microstructured adhesive.

* * * * *